US007308756B2

(12) United States Patent
Nishiyama

(10) Patent No.: US 7,308,756 B2
(45) Date of Patent: Dec. 18, 2007

(54) APPARATUS USED FOR MANUFACTURING SEMICONDUCTOR DEVICE, METHOD OF MANUFACTURING THE SEMICONDUCTOR DEVICES, AND SEMICONDUCTOR DEVICE MANUFACTURED BY THE APPARATUS AND METHOD

(75) Inventor: Yoshihide Nishiyama, Chino (JP)

(73) Assignee: Seiko Epson Corporation (JP)

( * ) Notice: Subject to any disclaimer, the term of this patent is extended or adjusted under 35 U.S.C. 154(b) by 486 days.

(21) Appl. No.: 10/925,898

(22) Filed: Aug. 25, 2004

(65) Prior Publication Data

US 2005/0071989 A1 Apr. 7, 2005

(30) Foreign Application Priority Data

Sep. 11, 2003 (JP) ............................. 2003-320008

(51) Int. Cl.
*B23P 19/00* (2006.01)
(52) U.S. Cl. .............................. 29/739; 29/740; 29/741
(58) Field of Classification Search .................. 29/825, 29/739, 740, 741
See application file for complete search history.

(56) References Cited

U.S. PATENT DOCUMENTS

| | | | | | |
|---|---|---|---|---|---|
| 5,228,358 | A | * | 7/1993 | Sakino et al. ............. | 74/479.01 |
| 5,864,389 | A | * | 1/1999 | Osanai et al. ................ | 355/53 |
| 5,996,437 | A | * | 12/1999 | Novak et al. ............. | 74/490.09 |
| 6,134,981 | A | * | 10/2000 | Novak et al. ............. | 74/490.09 |
| 6,408,045 | B1 | * | 6/2002 | Matsui et al. ................ | 378/34 |
| 6,603,531 | B1 | * | 8/2003 | Binnard ....................... | 355/53 |
| 6,844,694 | B2 | * | 1/2005 | Binnard ....................... | 318/649 |
| 6,927,838 | B2 | * | 8/2005 | Ono et al. .................... | 355/72 |
| 6,958,808 | B2 | * | 10/2005 | Tanaka et al. ................ | 355/72 |
| 2004/0075822 | A1 | * | 4/2004 | Hattori ........................ | 355/72 |

FOREIGN PATENT DOCUMENTS

| | | |
|---|---|---|
| JP | 11-097839 | 4/1999 |
| WO | WO 00/02239 * | 1/2000 |

* cited by examiner

*Primary Examiner*—Carl J. Arbes
(74) *Attorney, Agent, or Firm*—Harness, Dickey & Pierce, P.L.C.

(57) ABSTRACT

An apparatus for manufacturing semiconductor devices having a roughly rectangular parallelepiped box-shape includes an internal insertion space for semiconductor packages, first guide grooves and arranged along the longitudinal direction in both side surfaces facing the insertion space and second guide grooves and arranged parallel to the first guide grooves and respectively. Edge portions of an upper semiconductor package (a semiconductor component) are loosely fitted into the second guide grooves so that the movement of the upper semiconductor package in the left and right direction is restricted. Further, edge portions of a lower semiconductor package (a substrate for mounting semiconductor components) are loosely fitted into the first guide grooves so that the movement of the lower semiconductor package in the left and right direction is restricted. By using the apparatus, it becomes possible to provide a semiconductor device in which poor connections are difficult to occur, and further to provide an apparatus for manufacturing semiconductor devices and a method of manufacturing semiconductor devices that enable to prevent the occurrence of such poor connections in the obtained semiconductor devices and also enable to reduce manufacturing costs.

13 Claims, 14 Drawing Sheets

(d)

(e)

APPARATUS USED FOR MANUFACTURING SEMICONDUCTOR DEVICE, METHOD OF MANUFACTURING THE SEMICONDUCTOR DEVICES, AND SEMICONDUCTOR DEVICE MANUFACTURED BY THE APPARATUS AND METHOD

BACKGROUND OF THE INVENTION

1. Field of the Invention

The present invention relates to an apparatus for manufacturing semiconductor devices, a method of manufacturing the semiconductor devices, and a semiconductor device manufactured by the apparatus and method.

2. Description of the Prior Art

In general, when manufacturing a semiconductor device, a semiconductor chip is mounted on top of a substrate, and then a process for connecting the semiconductor chip and the substrate is carried out by soldering.

In the prior art, this kind of process is carried out by a method like that disclosed in Japanese Laid-Open Patent Application No. H 11-97839 (see lines 14 to 24 in the left column of page 10), for example.

Namely, using a mounter, a semiconductor chip (semiconductor component) is mounted on top of a substrate (that is, a substrate for mounting semiconductor components), and then the substrate having the semiconductor chip mounted thereon is conveyed through the inside of a reflow furnace to melt and solidify solder provided at the terminal portions of the substrate. In this way, the semiconductor chip and the substrate are connected to manufacture a semiconductor device. However, in this method, after the semiconductor chip is mounted on the top of the substrate, the substrate is conveyed to the reflow furnace. At that time, there are cases where the position of the semiconductor chip is dislocated due to vibration and the like. Further, the substrate normally has a shape in the form of a long plate-shaped frame, and in this case, when connecting the semiconductor chip and the substrate, there are many cases where the substrate and the semiconductor chip are subjected to a very large heat energy compared with the heat energy required to melt the solder. Namely, when the substrate has such a long plate shape, a relatively long time is required for the substrate to pass through the reflow furnace, and this makes the heat energy (heat history) received by the substrate and the semiconductor chip become larger than necessary. As a result, warping and the like can easily occur in the substrate, and there is the possibility that the semiconductor chip will experience adverse effects.

When this kind of dislocation, warping and the like occur, a poor solder connection is easily created between the substrate and the semiconductor chip, and this lowers the yield of semiconductor devices. Further, there is also the problem of lowering reliability of manufactured semiconductor devices.

Further, in recent years, the trend to create high functionality in electronic devices such as portable telephones and the like has become increasingly widespread. In accordance with this trend, there is a tendency that seeks for higher functionality demanded in semiconductor devices such as LSI and the like provided in electronic devices, but the effort to provide all functions demanded for these semiconductor devices in a single chip causes various problems such as long development periods and increased development costs for the semiconductor devices. In this regard, in order to solve these problems, semiconductor devices having a module structure in which semiconductor packages such as different types of LSI or the like are laminated and integrated have been used. However, the same problems described above also occur in the manufacturing of semiconductor devices having this kind of module structure.

SUMMARY OF THE INVENTION

It is an object of the present invention to provide a semiconductor device that makes it difficult for poor connections to occur, and further to provide an apparatus for manufacturing semiconductor devices and a method of manufacturing semiconductor devices that enable to prevent the occurrence of poor connections of the semiconductor device to be obtained and also enable to suppress manufacturing costs from being increased.

In order to achieve the above-identified object, the present invention is directed to an apparatus for manufacturing semiconductor devices, in which each semiconductor device comprises a substantially rectangular plate-shaped substrate for mounting semiconductor components thereon and a plate-shaped semiconductor component which is joined to the substrate for mounting semiconductor components, and the substrate for mounting semiconductor components has first opposite sides extending along a first direction and second opposite sides extending along a second direction which is substantially perpendicular to the first direction, wherein the apparatus comprising: first guide means for supporting the first sides of the substrate for mounting semiconductor components in a freely movable manner along the first direction while restricting the movement of the substrate for mounting semiconductor components in the second direction; and second guide means for loosely holding edge portions of the semiconductor component while restricting the movement of the semiconductor component in the second direction.

According to the present invention having the above structure, it is possible to provide an apparatus for manufacturing semiconductor devices that enables to prevent the occurrence of poor connections of the semiconductor device to be manufactured and also enables to suppress manufacturing costs from being increased in manufacturing the semiconductor device.

In the apparatus for manufacturing semiconductor devices according to the present invention, it is preferred that the second guide means includes restricting means for restricting the relative movement of the semiconductor component in the first direction with respect to the substrate for mounting semiconductor components.

This makes it possible to carry out the relative positioning of the substrate for mounting semiconductor components and the semiconductor component easily and reliably, and as a result, the reliability of the obtained semiconductor device will be especially high.

Further, in the apparatus for manufacturing semiconductor devices according to the present invention, it is also preferred that the first guide means and second guide means include grooves.

This makes it possible to easily insert the substrate for mounting semiconductor components and the semiconductor component into the apparatus for manufacturing semiconductor devices by sliding them. As a result, it is possible to carry out the relative positioning, joining and the like of the substrate for mounting semiconductor components and the semiconductor component more efficiently and this further improves the productivity of the semiconductor device.

Furthermore, in the apparatus for manufacturing semiconductor devices according to the present invention, it is also preferred that the width of each of the grooves of the second guide means is larger than the thickness of the semiconductor component.

This makes it possible to ensure free movement of the semiconductor device in the thickness direction and it is possible for the semiconductor component to make contact with the substrate for mounting semiconductor components easily and reliably by inverting the apparatus for manufacturing semiconductor devices in the up and down direction. As a result, it is possible to carry out the relative positioning, joining and the like of the substrate for mounting semiconductor components and the semiconductor component more efficiently and this further improves the productivity of the semiconductor device.

Furthermore, in the apparatus for manufacturing semiconductor devices according to the present invention, it is also preferred that when the substrate for mounting semiconductor components and the semiconductor component are loosely fitted into the first guide means and the second guide means, respectively, the difference between the width of each groove of the first guide means and the thickness of a portion of the substrate for mounting semiconductor components which is loosely fitted to the first guide means is smaller than the difference between the width of each groove of the second guide means and the thickness of a portion of the semiconductor component which is loosely fitted to the second guide means.

This makes it possible for the semiconductor component to make contact with the substrate for mounting semiconductor components easily and reliably. As a result, it is possible to carry out the relative positioning, joining and the like of the substrate for mounting semiconductor components and the semiconductor component more efficiently and this further improves the productivity of the semiconductor device.

Moreover, in the apparatus for manufacturing semiconductor devices according to the present invention, it is also preferred that the apparatus is formed into a roughly box-shape.

This makes it possible to easily handle the apparatus for manufacturing semiconductor devices. As a result, it is possible to carry out the relative positioning, joining and the like of the substrate for mounting semiconductor components and the semiconductor component more efficiently and this further improves the productivity of the semiconductor device.

Moreover, in the apparatus for manufacturing semiconductor devices according to the present invention, it is also preferred that the substrate for mounting semiconductor components and the semiconductor component can be inverted in up and down directions.

This makes it possible for the semiconductor component to make contact with the substrate for mounting semiconductor components easily and reliably by inverting the apparatus for manufacturing semiconductor devices in the up and down directions. As a result, it is possible to carry out the relative positioning, joining and the like of the substrate for mounting semiconductor components and the semiconductor component more efficiently and this further improves the productivity of the semiconductor devices.

Moreover, in the apparatus for manufacturing semiconductor devices according to the present invention, it is also preferred that the substrate for mounting semiconductor components is formed into a frame shape on which two or more of the semiconductor components can be mounted and the semiconductor components are formed into individual units.

This makes it possible to easily obtain a plurality of semiconductor devices being formed into individual units by cutting the substrate for mounting semiconductor components into pieces.

Moreover, in the apparatus for manufacturing semiconductor devices according to the present invention, it is also preferred that two or more of the semiconductor components are mounted on the substrate for mounting semiconductor components so that the semiconductor components are arranged along a plurality of lines.

This makes it possible to efficiently manufacture a large number of semiconductor devices through less number of steps.

Moreover, in the apparatus for manufacturing semiconductor devices according to the present invention, it is also preferred that the apparatus for manufacturing semiconductor devices includes pressing means for pressing the substrate for mounting semiconductor components and/or the semiconductor component so as to bring the semiconductor component close to the substrate for mounting semiconductor components.

This makes it possible to more efficiently prevent warping and the like of the substrate for mounting semiconductor components due to the high-temperature atmosphere. As a result, this further improves the reliability of the connection between the semiconductor components and the substrate for mounting semiconductor components in the semiconductor devices.

Moreover, in the apparatus for manufacturing semiconductor devices according to the present invention, it is also preferred that a plate-shaped partition means is arranged between the first guide means and the second guide means.

This makes it possible to further efficiently prevent an inadvertent contact between the substrate for mounting semiconductor components and the semiconductor component at the time the semiconductor component is inserted into the apparatus for manufacturing semiconductor devices. Further, when the apparatus for manufacturing semiconductor devices is inverted in the up and down direction or the like, it is possible to efficiently prevent dislocation of the semiconductor component from the relative position corresponding to the position of the substrate for mounting semiconductor components due to collisions between the semiconductor component and the substrate for mounting semiconductor components.

Another aspect of the present invention is directed to a method of manufacturing semiconductor devices which is characterized by using the apparatus for manufacturing semiconductor devices as described above.

According to the invention described above, it is possible to provide the method of manufacturing the semiconductor devices that enables to prevent the occurrence of poor connections of the semiconductor device to be obtained and also enables to suppress manufacturing costs from being increased.

The other aspect of the present invention is also directed to a method of manufacturing semiconductor devices, in which each semiconductor device comprises a substantially rectangular plate-shaped substrate for mounting semiconductor components and a plate-shaped semiconductor component which is joined to the substrate for mounting semiconductor components, and the substrate for mounting semiconductor components has first opposite sides extending along a first direction and second opposite sides extending along a second direction which is substantially perpendicular to the first direction, wherein the method comprising the steps of: a first guide step in which edge portions of the substrate for mounting semiconductor components corresponding to the first sides thereof are loosely fitted to a first guide means while restricting the movement of the substrate for mounting semiconductor components in the second direction; a second guide step in which edge portions of the semiconductor component corresponding to the first sides thereof are loosely fitted while restricting the movement of the semiconductor component in the second direction; a displacing step in which the semiconductor component is displaced by a prescribed distance in the thickness direction thereof to make contact with the substrate for mounting semiconductor components thorough a solder; and a heating step in which the semiconductor component and the substrate for mounting semiconductor components are heated in the state where the semiconductor component and the substrate for mounting semiconductor components are in contact with each other through the solder.

According to the invention described above, it is possible to provide the method of manufacturing the semiconductor devices that enables to prevent the occurrence of poor connections of the semiconductor device to be obtained and also enables to suppress manufacturing costs from being increased.

Yet other aspect of the present invention is directed to a semiconductor device which is characterized by being manufactured using the apparatus for manufacturing semiconductor devices as described above.

According to the invention described above, it is possible to provide the semiconductor device in which poor connections are difficult to occur and which has high reliability.

The semiconductor device according to the present invention is also characterized by being manufactured by the method described above.

This also makes it possible to provide the semiconductor device in which poor connections are difficult to occur and which has high reliability.

As described above, according to the present invention, it is possible to provide the semiconductor device in which poor connections are difficult to occur. Further, it is also possible to provide the apparatus for manufacturing semiconductor devices and the method of manufacturing semiconductor devices that enable to prevent the occurrence of poor connections of the semiconductor device to be obtained and also enable to suppress manufacturing costs from being increased.

Further, when the substrate for mounting semiconductor components and the semiconductor component mounted on the substrate for mounting semiconductor components are conveyed, it is possible to prevent dislocation of the semiconductor component due to vibrations and the like, and this makes it possible to eliminate the need for a mounter and an apparatus having a complex structure for manufacturing semiconductor devices. In this way, it is possible to prevent poor connection of the semiconductor device to occur and also possible to reduce costs in the manufacturing process of semiconductor devices.

The above and other objects, structures and advantages of the present invention will be more apparent when the following description of the preferred embodiments will be considered taken in conjunction with the accompanying drawings.

BRIEF DESCRIPTION OF THE DRAWINGS

FIG. 3 is a drawing which shows one example structure of a substrate for mounting semiconductor components (lower semiconductor package), wherein

FIG. 4 is a drawing which shows one example structure of the semiconductor component (upper semiconductor package), wherein

DETAILED DESCRIPTION OF THE PREFERRED EMBODIMENTS

A description of the preferred embodiments of an apparatus for manufacturing semiconductor devices according to the present invention will be given below.

First, a semiconductor device and an apparatus for manufacturing semiconductor devices according to a first embodiment of the present invention will be described.

Figure 1:
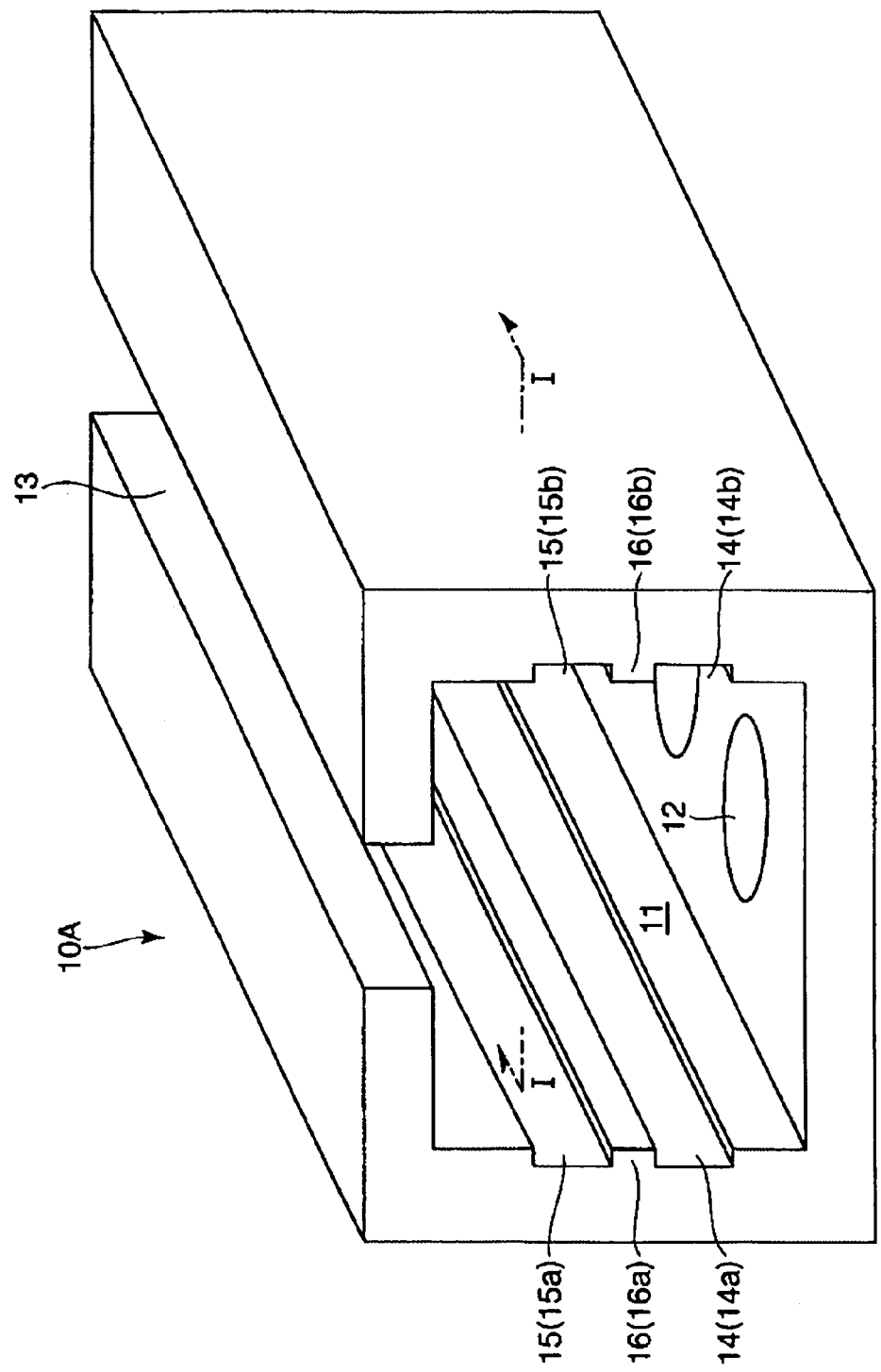
FIG. 1 is a perspective view which shows an apparatus for manufacturing semiconductor devices according to a first embodiment of the present invention.
Figure 2:
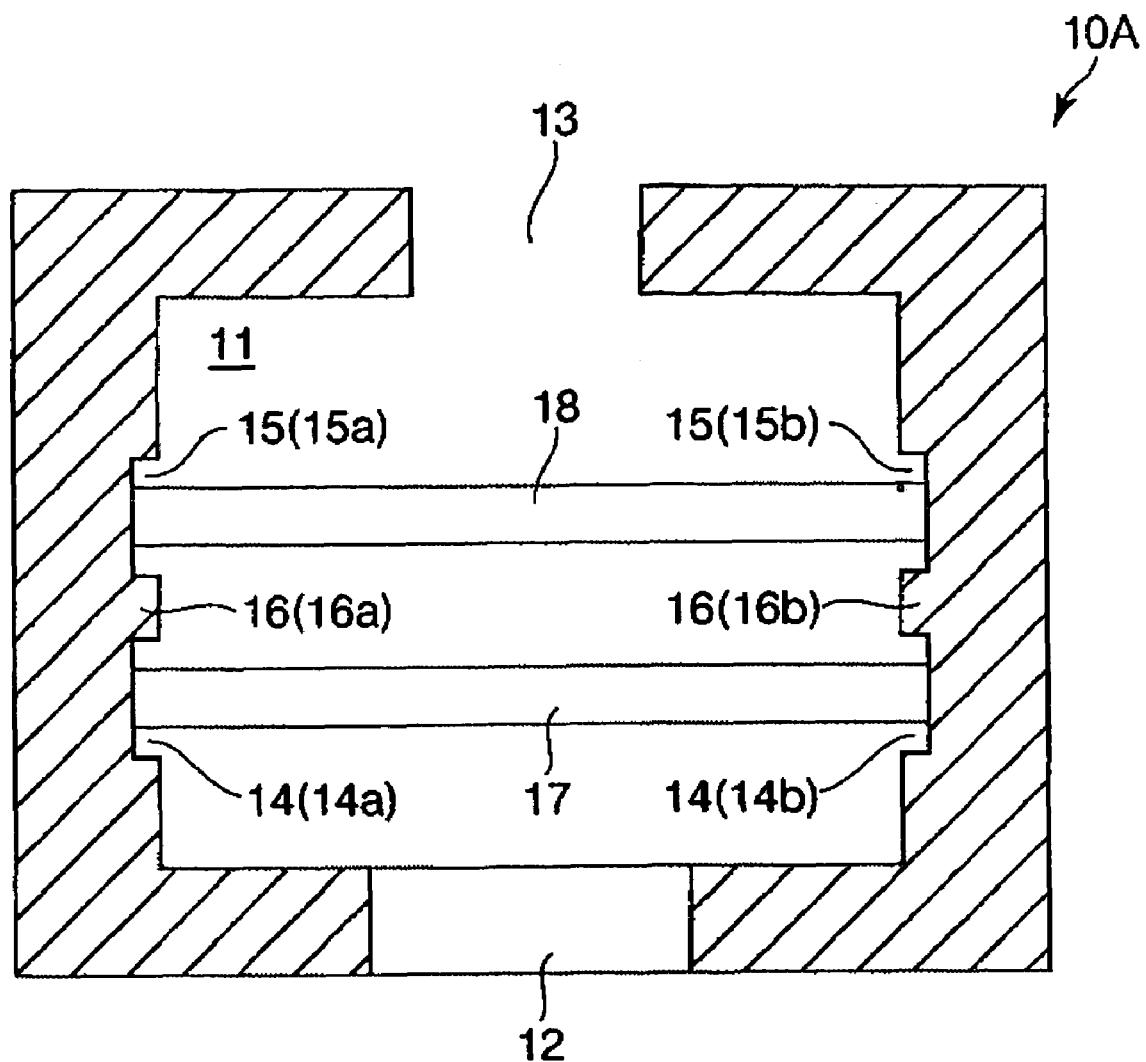
FIG. 2 is a cross-sectional view taken along the lines I-I in FIG. 1.
Figure 3A:
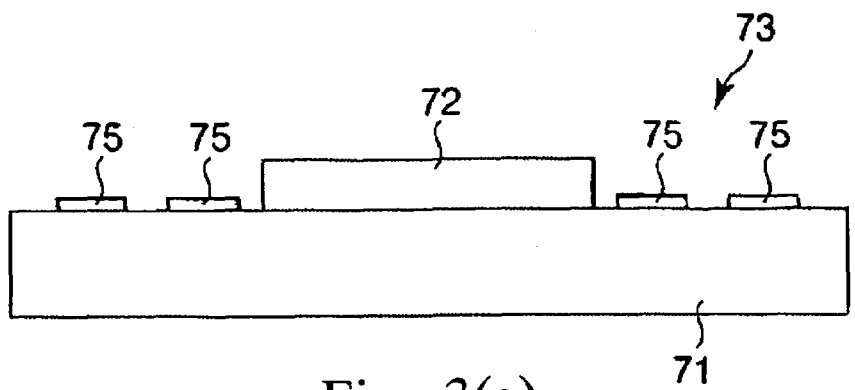
FIG. 3(a) is a cross-sectional view of the substrate for mounting semiconductor components.
Figure 3B:
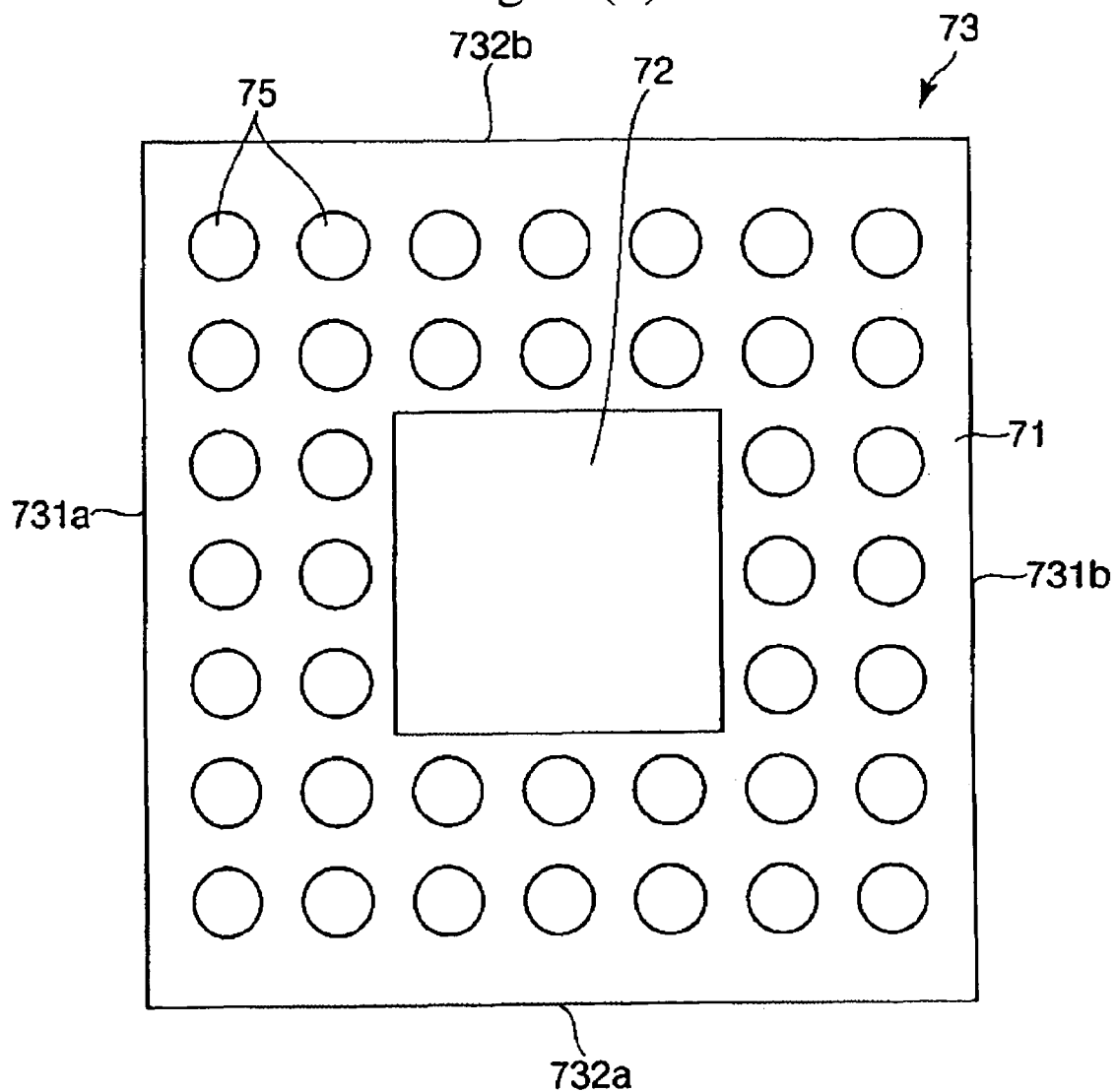
FIG. 3(b) is a plan view of the substrate for mounting semiconductor components.
Figure 4A:
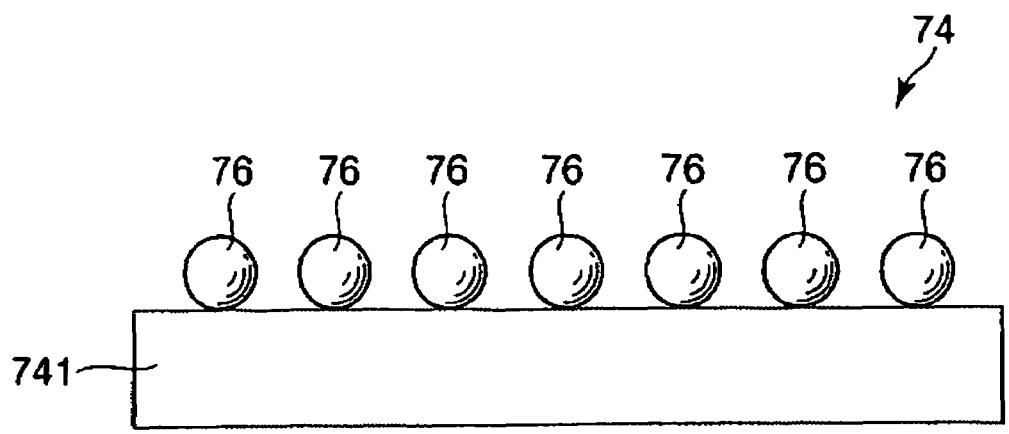
FIG. 4(a) is a cross-sectional view of the semiconductor component.
Figure 4B:
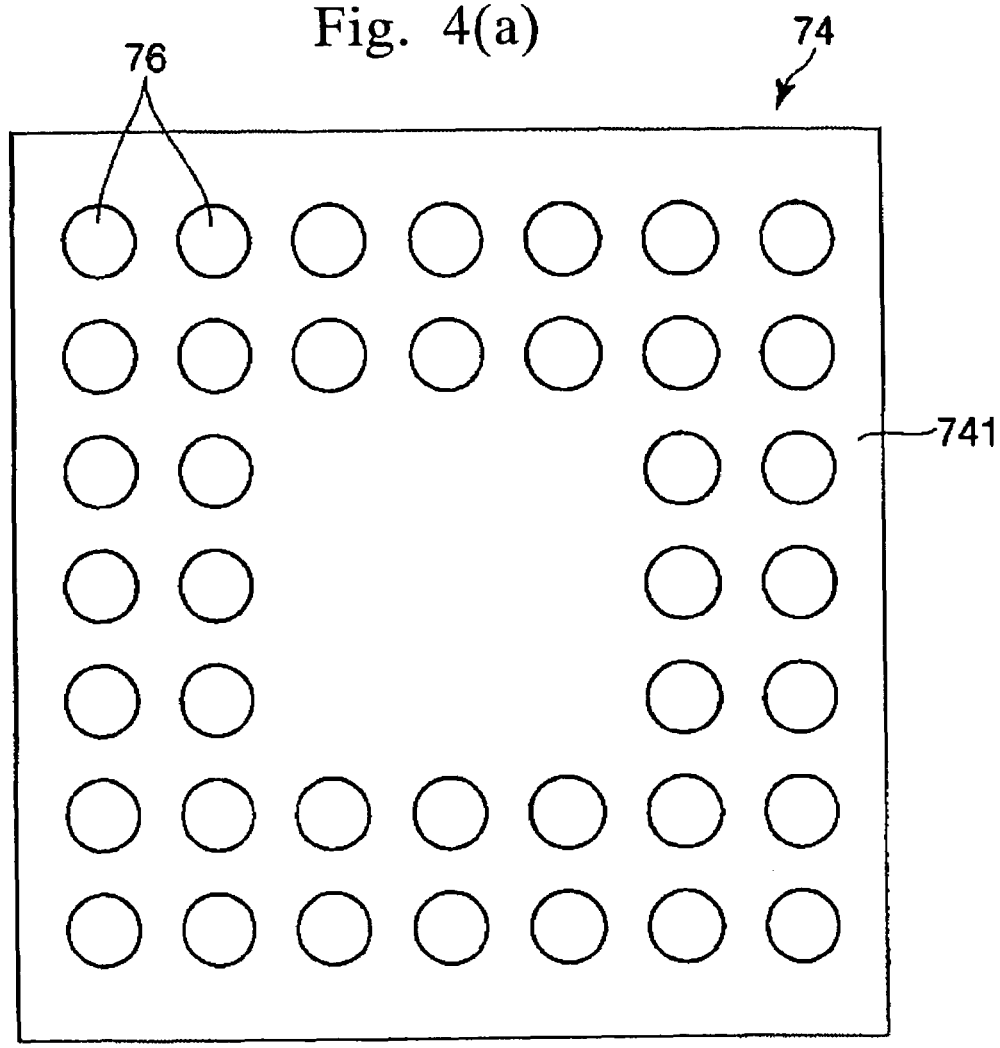
FIG. 4(b) is a plan view of the semiconductor component.
Figure 5:
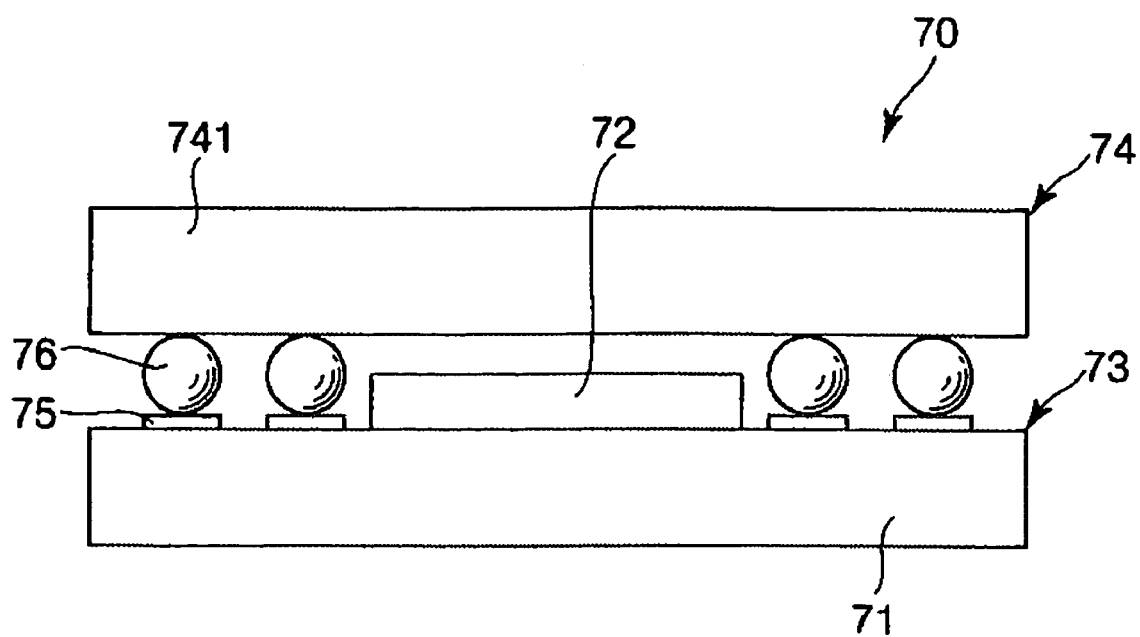
FIG. 5 is a cross-sectional view which shows one example structure of a semiconductor device of the present invention.

FIG. 1 is a perspective view which shows an apparatus for manufacturing semiconductor devices according to the first embodiment of the present invention, FIG. 2 is a cross-sectional view taken along the lines I-I in FIG. 1, and FIG. 3 is a drawing which shows one example structure of a substrate for mounting semiconductor components (lower semiconductor package), wherein FIG. 3(a) is a cross-sectional view of the substrate for mounting semiconductor components, and FIG. 3(b) is a plan view of the substrate for mounting semiconductor components. Further, FIG. 4 is a drawing which shows one example structure of semiconductor components (upper semiconductor package), wherein FIG. 4(a) is a cross-sectional view of the semiconductor components, and FIG. 4(b) is a plan view of the semiconductor components. Further, FIG. 5 is a cross-sectional view which shows one example structure of a semiconductor device of the present invention.

Before describing the semiconductor device, a description will be given for the lower semiconductor package (substrate for mounting semiconductor components) and the upper semiconductor package (semiconductor components) used in the present embodiment.

A lower semiconductor package (substrate for mounting semiconductor components) 73 includes a plate-shaped substrate 71, a driver IC 72 which is mounted using an ACF (Anisotropic Conductive Film), and a plurality of lands 75 which are used as terminals (see FIG. 3).

The substrate 71 is constructed from a semiconductor material such as Si or the like, or a resin material such as aramid resin or the like, for example. The thickness (average thickness) of the substrate 71 has no particular limitation, but is normally in the range of 0.05 to 1 mm. Further, the substrate 71 is not limited to one being constructed by a single layer, and may be constructed as a laminated body having a plurality of layers.

The lands 75 are provided in a pattern corresponding to the arrangement of solder balls 76 on an upper semiconductor package (semiconductor component) 74 described later.

The lands 75 may be formed by various plating methods or the like such as an electroless plating method, an electrolytic plating method or the like, but it is preferred that the lands 75 are formed by an electroless plating method. By forming the lands 75 using an electroless plating method, it is possible to create (design) an arrangement in which the spacing (pitch) between adjacent lands 75 is made smaller (about 5 to 30 μm, for example). This arrangement is ideally suited to creating a narrow pitch (creating a high precision arrangement for the terminals) required to give a semiconductor device 70 and an electronic device (a portable telephone or the like, for example) equipped with the semiconductor device 70 high performance and compactness.

Examples of the constituent material of the lands 75 include Ni, Au, Cu, Sn, Ag and an alloy of these. Among these materials, Ni, Au, Cu, Sn or an alloy of these is particularly preferred. These materials have excellent electrical conductivity, and excellent adhesion with the constituent materials of the driver IC 72 and the solder balls 76 described later.

Each of the lands 75 has roughly the same thickness (height), and this thickness (average thickness) is not limited to any particular value, but is preferably within the range of about 5 to 30 μm, for example. Further, the cross-sectional area of the lands 75 is not limited to any particular value, but is preferably within the range of about $5\times10^{-3}$ to $5\times10^{-2}$ mm$^2$.

These lands 75 can be formed on the surface of the substrate 71 by a photolithography method, for example, in which a desired resist pattern is formed, and then using this resist pattern as a mask, an electroless plating method is carried out to form the lands 75.

The lower semiconductor package (substrate for mounting semiconductor components) 73 has an substantially rectangular frame shape as a whole, and includes first sides 731a, 731b which extend along a first direction, and second sides 732a, 732b which extend along a second direction that is substantially perpendicular to the fist direction.

Further, the upper semiconductor package (semiconductor component) 74 has an substantially rectangular plate shape, and includes an upper semiconductor package body 741 in which three layers of memory are laminated, and a plurality of solder balls 76 arranged to correspond with each land 75 of the lower semiconductor package 73 (see FIG. 4).

The constituent material of the solder balls 76 is not limited to any particular material, but preferably a solder material is used as the main component. The solder material should melt at a relatively low temperature and have excellent electrical conductivity, and should be easy to obtain. Examples of such a solder material include a Pb-containing solder such as Pb—Sn type solder and the like, a lead-free solder (solder that does not contain Pb) such as Sn—Ag—Cu type solder, Sn—Zn type solder, Sn—Cu type solder, Sn—Bi type solder and the like, silver solder, copper solder, copper phosphate solder, brass solder, aluminum solder, nickel solder and the like, and one of these or a combination of two or more of these. Among these materials, Pb-containing solder, or lead-free solder (solder that does not contain Pb) is preferably used. In particular, lead-free solder (solder that does not contain Pb) is especially beneficial in view of both connection strength and effects on the environment.

The method of forming the solder balls 76 is not limited to any particular method, and may be a wet plating method such as a dipping method, a printing method, electrolytic plating, immersion plating, electroless plating and the like, a chemical vapor deposition (CVD) method such as heat CVD, plasma CVD, laser CVD and the like, a dry plating method such as vacuum deposition, spattering, ion plating and the like, flame spray coating and the like. Among these methods, the dipping method or the printing method is particularly preferred. Either of these methods makes it possible to form the solder balls 76 easily and reliably.

In the case where the dipping method is used, the solder balls 76 can be formed by immersing the ends of terminals (not shown in the drawings) of the upper semiconductor package 74 into the constituent material of the solder balls 76 in a molten state, for example.

Further, in the case where the printing method is used, the solder balls 76 can be formed by applying a mask having through holes to the upper semiconductor package 74, and then brushing on the constituent material of the solder balls 76 in a molten state with a squeegee to supply the constituent material to the upper surface of the upper semiconductor package 74 via the through holes, for example. Further, the resist pattern used at the time the lands 75 are formed by the electroless plating method can be used with this mask.

As shown in FIG. 5, the semiconductor device 70 is formed by integrating the lower semiconductor package (substrate for mounting semiconductor components) 73 and the upper semiconductor package (semiconductor component) 74 by connecting the plurality of lands 75 and the plurality of solder balls 76 formed at positions corresponding to the lands 75. This kind of semiconductor device 70 is manufactured using an apparatus for manufacturing semiconductor devices and a method of manufacturing semiconductor devices described below.

Next, a first embodiment of an apparatus for manufacturing semiconductor devices will be described below. In the description given below, the upper side in FIG. 1 and FIG. 2 is referred to as "upper", and the lower side is referred to as "lower".

The apparatus 10A for manufacturing semiconductor devices shown in FIG. 1 and FIG. 2 has substantially rectangular parallelepiped box-shape which includes an internal insertion space 11 for the semiconductor packages (that is, for inserting semiconductor components and a substrate for mounting semiconductor components), and the insertion space 11 is open at both end faces (that is, the front and rear end faces) in the longitudinal directions. The insertion space 11 communicates with the outside of the apparatus 10A for manufacturing semiconductor devices via a plurality of through holes 12 arranged in the bottom surface of the apparatus 10A, and communicates with the outside of the apparatus 10A via a through slot 13 formed in the upper surface of the apparatus 10A along the longitudinal direction thereof.

When the surrounding atmosphere of the apparatus 10A for manufacturing semiconductor devices reaches a high temperature (when the apparatus 10A for manufacturing semiconductor devices is inserted inside a reflow furnace, for example), for example, the high-temperature atmosphere is efficiently introduced into the insertion space 11 through the through holes 12 and the through slot 13, thereby making it possible to improve the heating efficiency of the lower semiconductor package 73 and the upper semiconductor package 74 inserted inside the insertion space 11.

Further, the apparatus 10A for manufacturing semiconductor devices is formed with first guide grooves (first guide means) 14a, 14b arranged along the longitudinal direction described above in both side surfaces facing the insertion space, second guide grooves (second guide means) 15a, 15b provided above the first guide grooves (rails) 14a, 14b and arranged parallel to the first guide grooves 14a, 14b, and protruding portions 16a, 16b formed between the first guide groove 14a and the second guide groove 15a and between the first guide groove 14b and the second guide groove 15b by these guide grooves. Further, the apparatus 10A is also equipped with a first stopper plate 17 arranged to span the space from the first guide groove 14a to the first guide groove 14b at one end (rear end) of the apparatus 10A in the longitudinal direction thereof, and a second stopper plate (restriction means) 18 arranged to span the space from the second guide groove 15a to the second guide groove 15b at the rear end of the apparatus 10A.

In the apparatus 10A for manufacturing semiconductor devices, the upper semiconductor package 74 (semiconductor components) is slid along the second guide grooves (rails) 15a, 15b and inserted into the inside of the insertion space 11. Similarly, in the apparatus 10A, the lower semiconductor package 73 (substrate for mounting semiconductor components) is slid along the first guide grooves 14a, 14b and inserted into the inside of the insertion space 11. At this time, edge portions corresponding to the first sides 731a, 731b of the lower semiconductor package 73 loosely fit inside the first guide grooves 14a, 14b, respectively (whereby the lower semiconductor package 73 is movably supported in the first direction).

In this way, in the apparatus 10A for manufacturing semiconductor devices, because the upper semiconductor package 74 (semiconductor components) can be inserted into the inside of the insertion space 11 through the second guide grooves 15 and the lower semiconductor package 73 (substrate for mounting semiconductor components) can be inserted into the insertion space 11 through the first guide grooves 14 (14a, 14b), the lower semiconductor package 73 and the upper semiconductor package 74 can be placed inside the apparatus 10A easily.

Further, in the apparatus 10A for manufacturing semiconductor devices, the space between the second guide groove 15a and the second guide groove 15b is slightly larger than the width of the upper semiconductor package 74, and the length (groove width) of the second guide grooves 15 in the up and down direction is larger than the thickness of the upper semiconductor package 74 (the thickness of the substrate portion excluding the solder balls 76). In this way, the edge portions of the plate-shaped upper semiconductor package 74 can be loosely fitted easily and reliably into the second guide grooves 15, and the movement of the upper semiconductor package 74 in the left and right direction (second direction) in the drawings can be restricted.

Further, in the apparatus 10A for manufacturing semiconductor devices, the space between the first guide groove 14a and the first guide groove 14b is slightly larger than the width of the lower semiconductor package 73 (the length of the second sides 732a, 732b), and the length (groove width) of the first guide grooves 14 in the up and down direction is slightly larger than the thickness of the lower semiconductor package 73 (the thickness of the substrate 71). In this way, the edge portions corresponding to the first sides 731a, 731b of the lower semiconductor package 73 can be loosely fitted easily and reliably into the first guide grooves 14, and the movement of the lower semiconductor package 73 in the left and right direction (second direction) can be restricted.

Further, the difference between the length (groove width) of the second guide grooves 15 in the up and down direction and the thickness of the upper semiconductor package 74 (the thickness of the substrate portion excluding the solder balls 76) is larger than the difference between the length (groove width) of the first guide grooves 14 in the up and down direction and the thickness of the lower semiconductor package 73 (the thickness of the substrate 71). In this way, in the method of manufacturing semiconductor devices described later, the lands 75 and the solder balls 76 provided at positions corresponding to the lands 75 can make contact easily and reliably by inverting the apparatus 10A in the up and down direction, for example.

Further, because the first guide grooves 14 and the second guide grooves 15 are arranged parallel to each other as described above, the first guide grooves 14 (14a, 14b) and the second guide grooves 15 (15a, 15b) restrict relative movement of the lower semiconductor package 73 and the upper semiconductor package 74.

Accordingly, when the lower semiconductor package 73 and the upper semiconductor package 74 mounted on the lower semiconductor package 73 are conveyed together with the apparatus 10A for manufacturing semiconductor devices, it is possible to reliably prevent dislocation of the upper semiconductor package 74 due to vibrations and the like, and this makes it possible to eliminate the need for a mounter and an apparatus having a complex structure for manufacturing semiconductor devices. In this way, it is possible to prevent poor connections (poor solder connections) between the lower semiconductor package 73 and the upper semiconductor package 74, and it is possible to reduce costs in the manufacturing process of semiconductor devices.

Further, the apparatus 10A for manufacturing semiconductor devices is constructed so as to make contact with the lower semiconductor package 73 and the upper semiconductor package 74 only near the end portions thereof when the lower semiconductor package 73 and the upper semiconductor package 74 are inserted into the insertion space 11 (and as described later, this also includes the case where the apparatus 10A for manufacturing semiconductor devices is inverted in the up and down direction). Namely, the apparatus 10A for manufacturing semiconductor devices is constructed so that when the lower semiconductor package 73 and the upper semiconductor package 74 are inserted into the insertion space 11, there is a space (gap) between the bottom surface of the lower semiconductor package 73 and the apparatus 10A, and between the top surface of the upper semiconductor package 74 and the apparatus 10A. Accordingly, the apparatus 10A for manufacturing semiconductor devices does not make contact with the entire surface (bottom surface or top surface) of the lower semiconductor package 73 and the upper semiconductor package 74. In this way, it is possible to effectively prevent the heat supplied to the lower semiconductor package 73 and the upper semiconductor package 74 from being absorbed by the apparatus 10A, and this makes it possible to heat the lower semiconductor package 73 and the upper semiconductor package 74 efficiently. Further, in this way, it is possible to shorten the time the lower semiconductor package 73 and the upper semiconductor package 74 are exposed to a high-temperature atmosphere (that is, it is possible to restrict the heat history of the lower semiconductor package 73 and the upper semiconductor package 74), and this makes it possible for the finally obtained semiconductor device 70 to have especially high reliability.

Further, as described above, the apparatus 10A for manufacturing semiconductor devices is equipped with the first stopper plate 17 and the second stopper plate 18. In this way, by simply inserting the lower semiconductor package 73 until it abuts on the first stopper plate 17, and inserting the upper semiconductor package 74 until it abuts on the second cross plate 18, it is possible to more reliably regulate the relative positions of the lower semiconductor package 73 and the upper semiconductor package 74 in the longitudinal direction described above. Namely, it is possible to more reliably prevent accidental movement of the lower semiconductor package 73 and the upper semiconductor package 74 in the first direction. At this time, the prescribed distance between the first stopper plate 17 and the second stopper plate 18 is freely set in accordance with the lower semiconductor package 73 and the upper semiconductor package 74.

Further, as described above, the apparatus 10A for manufacturing semiconductor devices is formed to have a rectangular parallelepiped box-shape. In this way, the apparatus 10A can be handled easily (moved, carried or the like, for example) even when the lower semiconductor package 73 and the upper semiconductor package 74 are placed in the insertion space 11. In this regard, it is to be note that the apparatus 10A for manufacturing semiconductor devices preferably has a relatively thin frame thickness (10 to 15 mm, for example), and is preferably constructed from a metal having good thermal conductivity or a material that radiates heat (aluminum, titanium, copper alloy, stainless steel or the like, for example). In this way, because the thermal conductivity is improved, there is no need for an additional device such as a heater or the like, and this makes it possible to carry out soldering (create a solder connection, for example) between the lower semiconductor package 73 and the upper semiconductor package 74 reliably within a short time.

Next, a method of manufacturing semiconductor devices from the lower semiconductor package 73 and the upper semiconductor package 74 using the apparatus 10A for manufacturing semiconductor devices will be described with reference to the drawings.

Figure 6:
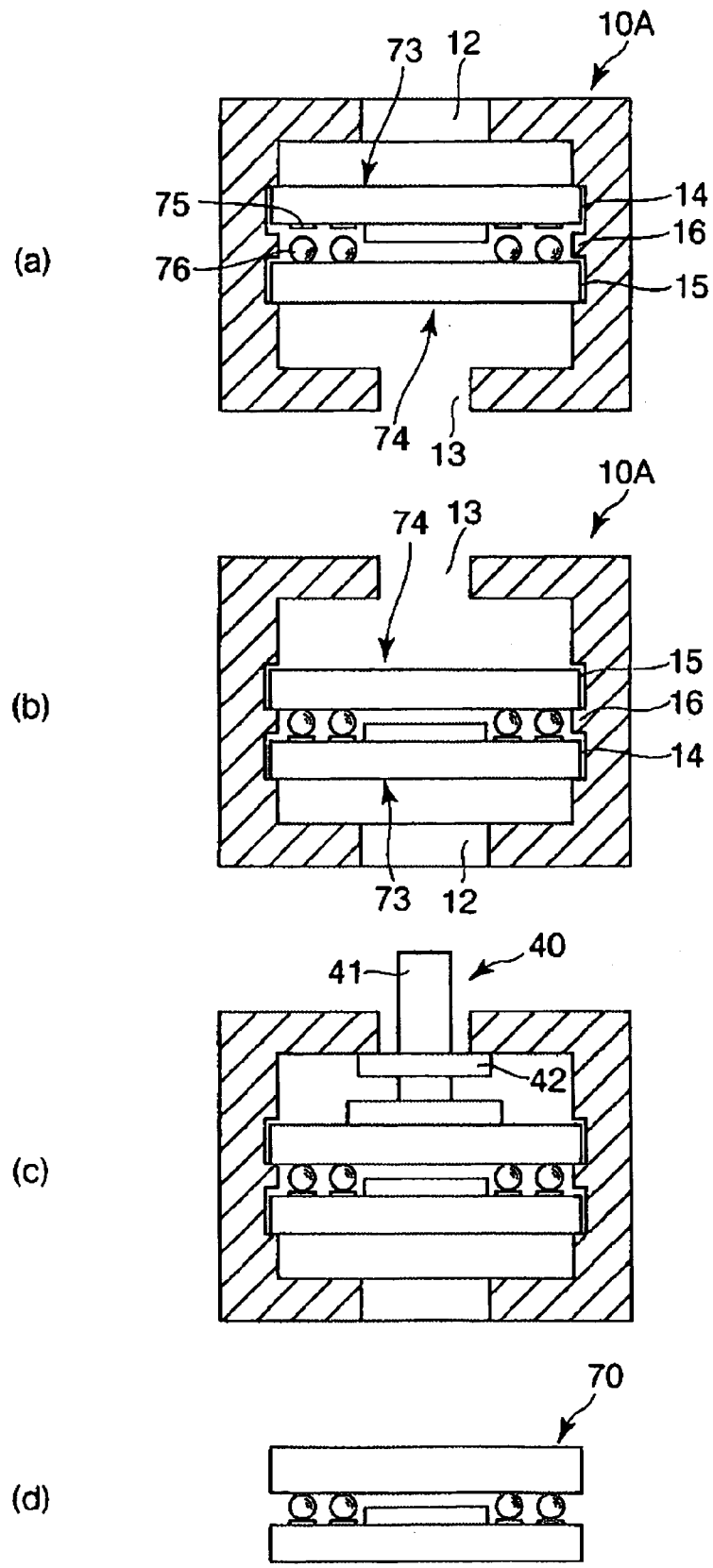
FIG. 6 is a drawing which shows one example of a method of manufacturing semiconductor devices using the apparatus for manufacturing semiconductor devices shown in FIG. 1 and FIG. 2.
Figure 7:
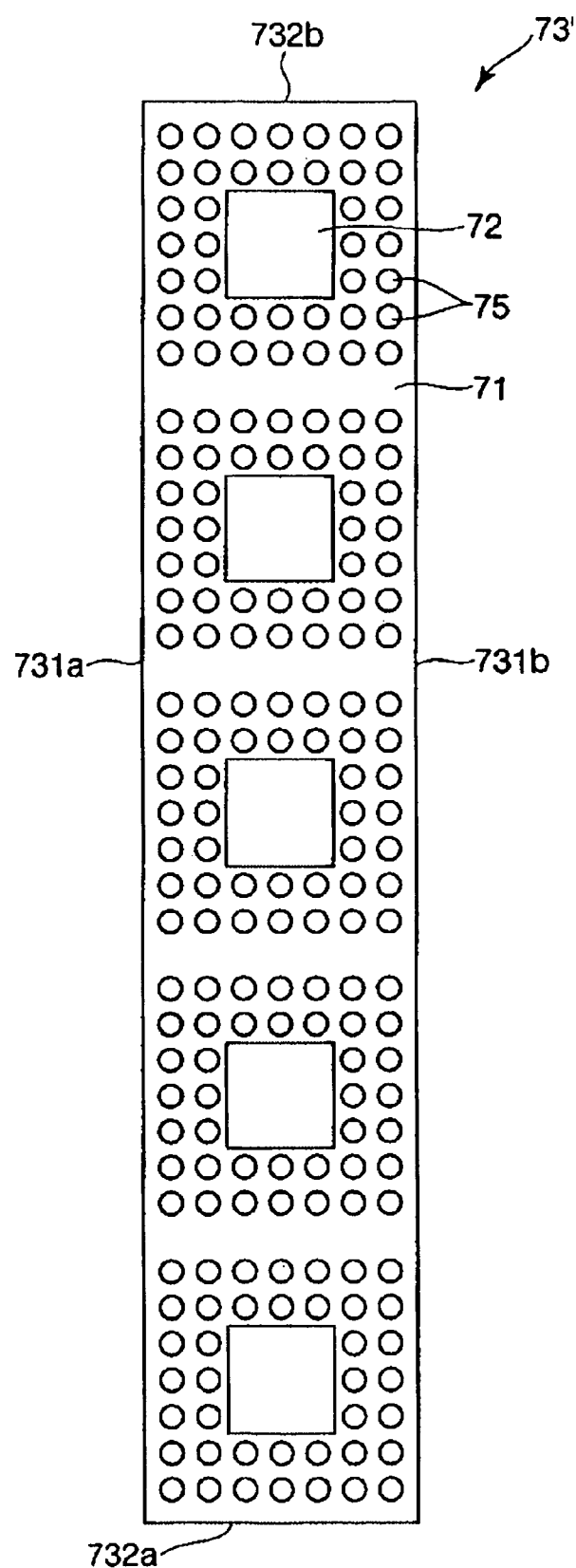
FIG. 7 is a plan view which shows another example of a structure of a substrate for mounting semiconductor components (lower semiconductor package).

FIG. 6 is a drawing which shows one example of a method of manufacturing semiconductor devices using the apparatus 10A for manufacturing semiconductor devices shown in FIG. 1 and FIG. 2, FIG. 7 is a plan view which shows another example of a structure of a substrate for mounting semiconductor components (lower semiconductor package). In the description given below, the upper side in FIG. 6 is referred to as "upper", and the lower side is referred to as "lower".

First, the apparatus 10A for manufacturing semiconductor devices is arranged so that the through holes 12 face upward in the drawings. Then, the upper semiconductor package 74 is inserted into the insertion space 11 along the second guide grooves 15, and the lower semiconductor package 73 on which a flux has been applied in advance on the surface provided with the lands 75 is inserted into the insertion space 11 along the first guide grooves 14. At this time, the upper semiconductor package 74 is inserted so that the surface provided with the solder balls 76 faces upward in the drawings, and the lower semiconductor package 73 is inserted so that the surface on which the flux is applied faces downward in the drawings (that is, so that the surface provided with the lands 75 faces downward). In this way, the solder balls 76 and the lands 75 face each other inside the insertion space 11 (see FIG. 6(a)).

At this time, the gap (distance) between the solder balls 76 and the lands 75 is normally preferred to be about 100 μm, but this gap may be established at any value in accordance with types of the lower semiconductor package 73 and the upper semiconductor package 74. Specifically, this gap is determined in accordance with various parameters such as the groove widths of the first guide grooves 14 and the second guide grooves 15, the gap (width) between the first guide grooves 14 and the second guide grooves 15 in the up and down direction in the drawings, the thickness of the substrate 71 or the lower semiconductor package 73, the height of the lands 75, the diameter of the solder balls 76, the application thickness of the flux and the like, but in all cases, the parameters described above are preferably set so that the solder balls 76 and the flux do not make contact when the lower semiconductor package 73 and the upper semiconductor package 74 are inserted.

Further, the flux applied to the surface of the lower semiconductor package 73 provided with the lands 75 may be either a rosin type flux or a water-soluble flux. Examples of a rosin type flux include rosin base flux, mildly activated rosin base flux, activated rosin base flux and the like, and even though any of these may be used, mildly activated rosin base flux is preferred in view of solderability (connectivity).

Next, the apparatus 10A for manufacturing semiconductor devices is inverted in the up and down direction by inverting means not shown in the drawings. At this time, as described above, because the groove width of the second guide grooves 15 is larger (about 100 μm, for example) than the thickness of the upper semiconductor package 74, it is possible to ensure free movement of the upper semiconductor package 74 in the up and down direction (thickness direction). Accordingly, when the apparatus 10A is inverted, the upper semiconductor package 74 moves downward in the drawings. Further, at this time, because the length of the protruding portions 16 (16a, 16b) in the up and down direction (hereafter referred to as the "thickness of the protruding portions 16") is established to be smaller than the total of the height of the lands 75 and the diameter of the solder balls 76 by about 200 μm, for example, the solder balls 76 make contact with corresponding lands 75 (see FIG. 6(b)). In this way, in the present embodiment, by inverting the apparatus 10A in the up and down direction, it is possible for the upper semiconductor package 74 to make optimum contact with the lower semiconductor package 73.

At this time, the degree of deformation of the solder balls 76 is determined in accordance with the thickness of the protruding portions 16, the diameter of the solder balls 76, the height of the lands 75 and the like, but because the diameter of the solder balls 76 exhibit a dispersion of about 10 μm, the thickness of the protruding portions 16 is set at a value that can absorb this dispersion in the range of about 100 to 200 μm, for example. Further, the thickness of the protruding portions 16 is set so as to be essentially the same as the distance between the upper semiconductor package 74 and the lower semiconductor package 73 after soldering.

Then, using a pressing device 40 equipped with a pressing rod 41 having a flat plate at one end thereof and a male screw formed on the shaft thereof, and a nut 42 screwed on the male screw of the shaft of the pressing rod 41, the upper semiconductor package 74 is pressed by a prescribed load (see FIG. 6(c)). Namely, using the pressing device 40, a prescribed load is added to the lower semiconductor package 73 via the upper semiconductor package 74. Next, with the upper semiconductor package 74 in this pressed state, the apparatus 10A is conveyed to the inside of a reflow furnace, and the upper semiconductor package 74 and the lower semiconductor package 73 are connected or soldered by reflow. The reflow conditions are not limited to any particular values, but the atmospheric temperature is within the range of about 150 to 300° C., and preferably within the range of about 200 to 260° C., for example, and the reflow time is within the range of about 1 to 30 minutes, and preferably within the range of about 3 to 10 minutes, for example. Further, this reflow may be carried out while supplying high frequency waves, ultrasound waves or the like as needed, for example.

In this way, in the apparatus 10A for manufacturing semiconductor devices, because the lower semiconductor package 73 is pressed indirectly by the pressing device 40, it is possible to prevent warping of the lower semiconductor package 73 due to the high-temperature atmosphere inside the reflow furnace. As a result, it is possible to more effectively prevent the occurrence of poor soldering connections between the lower semiconductor package 73 and the upper semiconductor package 74.

Then, after the apparatus 10A for manufacturing semiconductor devices is removed from the reflow furnace and the pressing by the pressing device is released, a semiconductor device 70 that was formed by connecting the upper semiconductor package 74 to the lower semiconductor package 73 by reflowing is removed from the apparatus 10A (see FIG. 6(d)).

The semiconductor device 70 obtained by the above mentioned way can be suitably used in portable telephones, inkjet type spraying devices (inkjet printers, for example), laptop type personal computers, televisions, video cameras, video tape recorders, car navigation devices, pagers, electronic notebooks (which include those having communication functions), electronic dictionaries, pocket calculators, electronic game devices, word processors, work stations, television telephones, television monitors for crime prevention, electronic binoculars, POS terminals, medical devices (electronic thermometers, blood pressure meters, blood sugar meters, electrocardiogram measuring devices, ultrasound diagnostic devices, electronic endoscopes, for example), fish finders, various measurement devices, gauges (gauges for vehicles, airplanes, ships and the like, for example), flight simulators and the like.

Further, in the foregoing, the description was given with regard to the case where one lower semiconductor package 73 and one upper semiconductor package 74 are inserted into the insertion space 11 of the apparatus 10A for manufacturing semiconductor devices and they are connected therein. However, in the present invention, it is also possible to insert a plurality of lower semiconductor packages 73 and a plurality of upper semiconductor packages 74 into the insertion space 11 of the apparatus 10A for manufacturing semiconductor devices along the longitudinal direction of the first guide grooves 14 and the second guide grooves 15, for example. In this way, a plurality of semiconductor devices 70 can be manufactured at the same time, and this makes it possible to improve the productivity of the semiconductor devices 70. In particular, in the present embodiment, because the length of the lower semiconductor package 73 in the first direction (the length of the first sides 731) and the length of the upper semiconductor package 74 in the first direction are essentially the same, this type of method is ideally suited for manufacturing the semiconductor devices 70.

Further, the lower semiconductor package may have the structure shown in FIG. 7, for example. Namely, a lower semiconductor package 73' may be formed into a structure equipped with a plurality of the lower semiconductor packages 73 described above. In this way, a plurality of upper semiconductor packages 74 may be mounted (connected) to one lower semiconductor package 73', and then by cutting this into a plurality of pieces (to form individual units), it is possible to obtain a plurality of semiconductor devices 70, whereby the productivity of the semiconductor devices 70 is improved. Further, by using this type of lower semiconductor package 73', the relative positioning of the lower semiconductor package 73 and the upper semiconductor package 74 can be carried out more accurately, and this improves the reliability of the obtained semiconductor devices 70.

Next, an apparatus for manufacturing semiconductor devices and a method of manufacturing semiconductor devices using the apparatus for manufacturing semiconductor devices according to a second embodiment of the present invention will be described. The following description will focus on the points of difference with the first embodiment, and therefore a description of the same elements is omitted.

Figure 8:
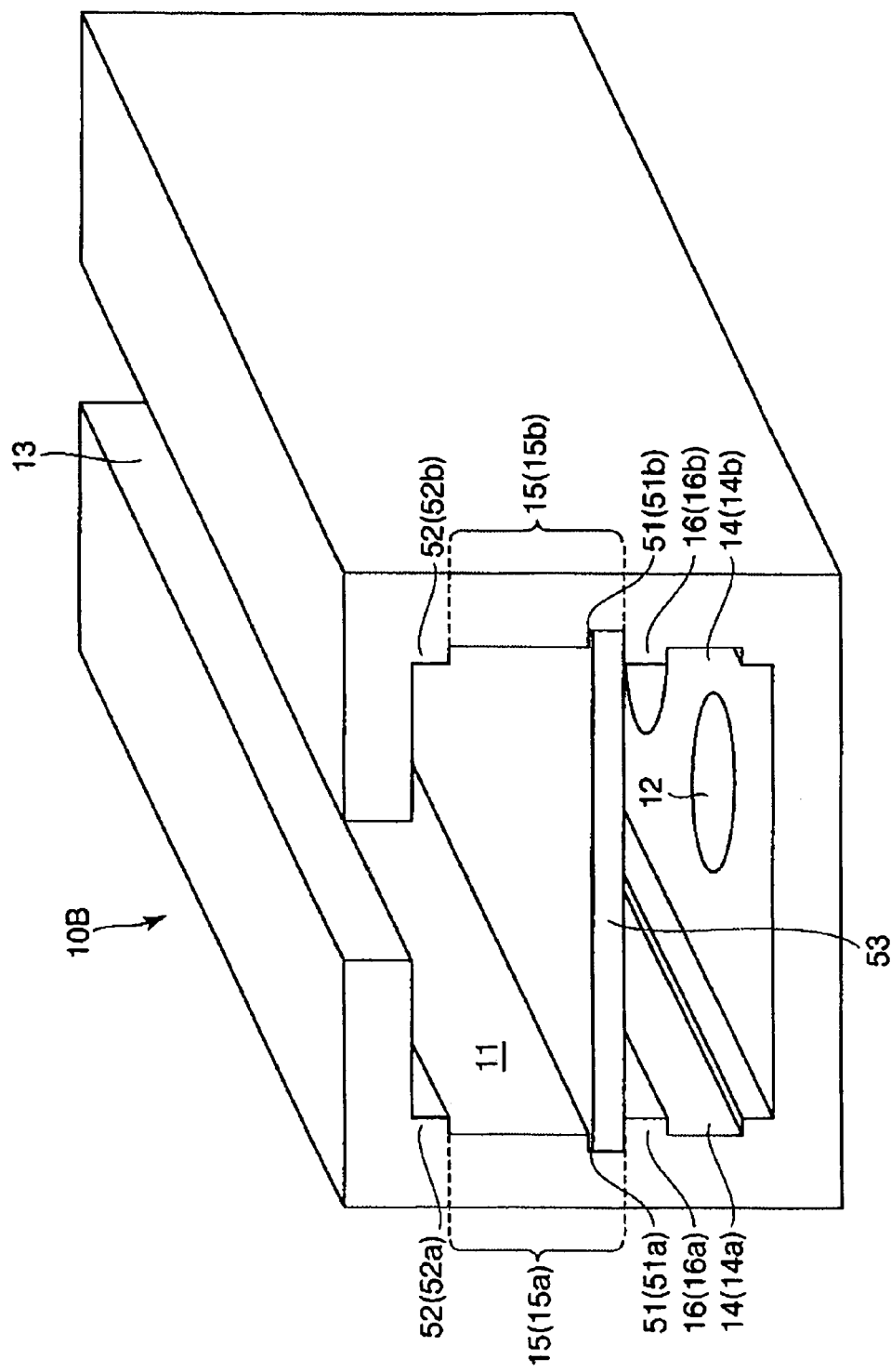
FIG. 8 is a perspective view which shows an apparatus for manufacturing semiconductor devices according to a second embodiment of the present invention.
Figure 9:
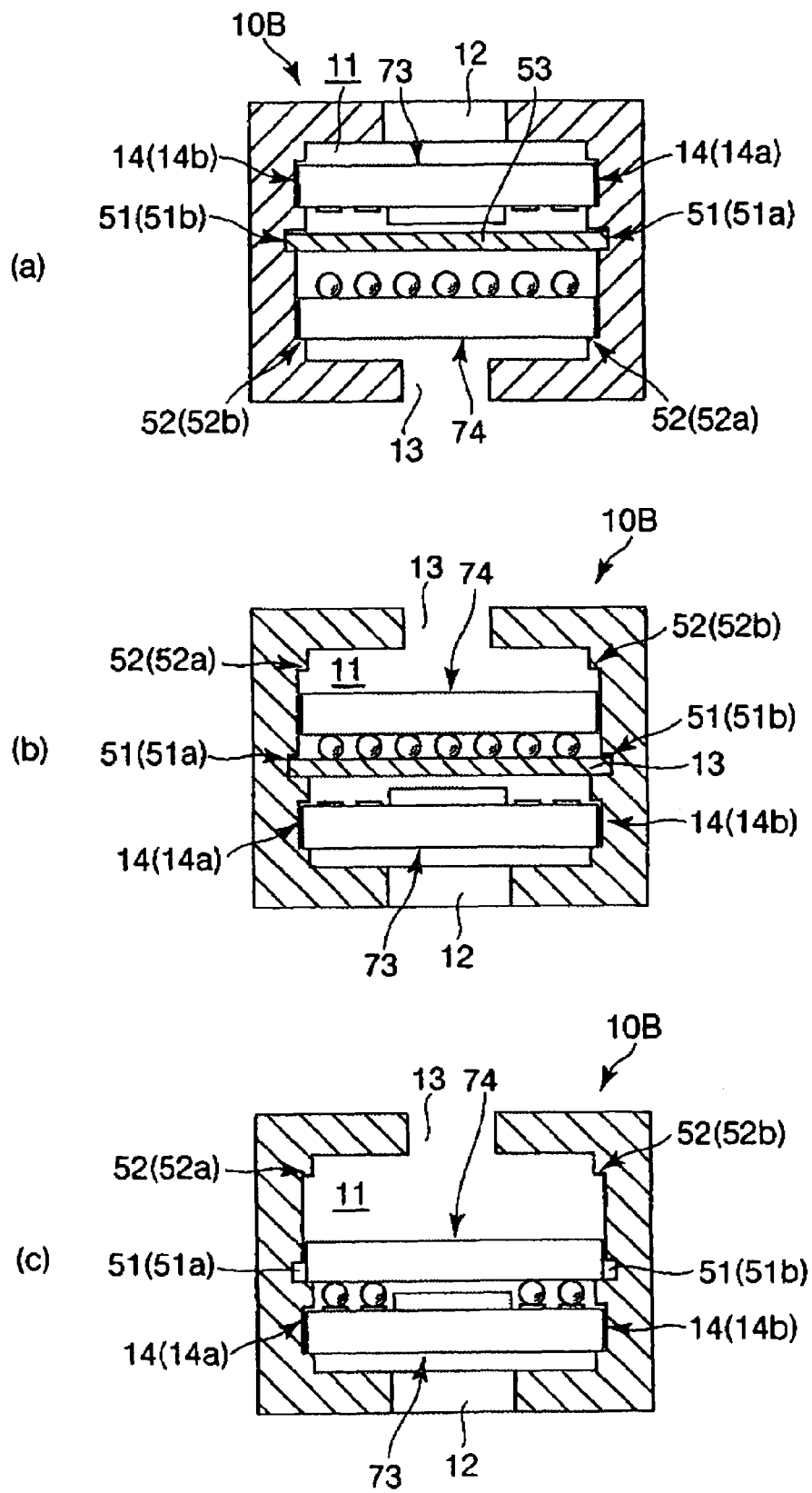
FIG. 9 is a drawing which shows one example of a method of manufacturing semiconductor devices using the apparatus for manufacturing semiconductor devices shown in FIG. 8.
Figure 10:
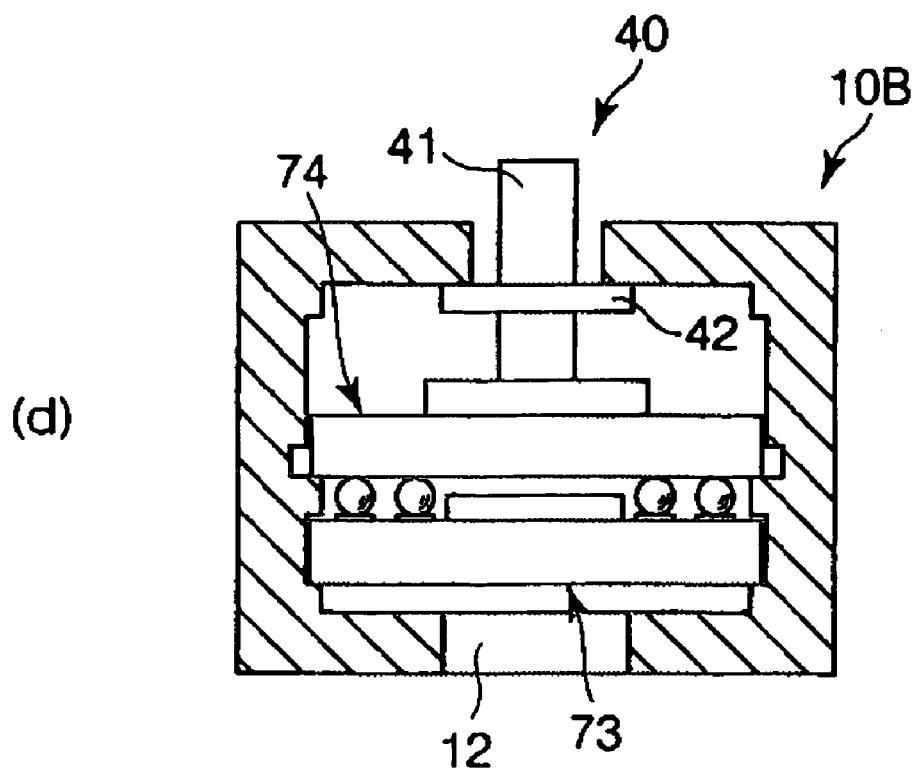
FIG. 10 is a drawing which is continued from FIG. 9 to show the method of manufacturing semiconductor devices using the apparatus for manufacturing semiconductor devices shown in FIG. 8.
Figure 10:
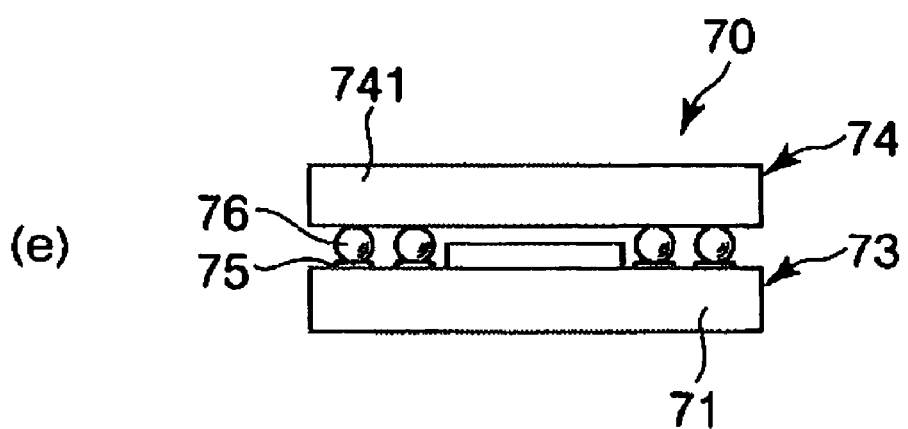

FIG. 8 is a perspective view which shows an apparatus for manufacturing semiconductor devices according to the second embodiment of the present invention, FIG. 9 and FIG. 10 are drawings which shows one example of a method of manufacturing semiconductor devices using the apparatus for manufacturing semiconductor devices shown in FIG. 8. Further, in the description given below, the upper side in FIG. 8 to FIG. 10 is referred to as "upper", and the lower side is referred to as "lower".

First, the structure of an apparatus 10B for manufacturing semiconductor devices of the second embodiment will be described.

As shown in FIG. 8, in addition to the first guide grooves 14a, 14b, the second guide grooves 15a, 15b, and the protruding portions 16a, 16b arranged in the longitudinal direction described above on both sides facing the insertion space 11, the apparatus 10B for manufacturing semiconductor devices further includes partition grooves 51a, 51b formed inside the second guide grooves 15a, 15b to be respectively parallel to the first guide grooves 14a, 14b, step-shaped guide supports 52a, 52b arranged inside the second grooves 15a, 15b to be respectively parallel to the first guide grooves 14a, 14b, and a flat plate-shaped partition plate 53 (partition means) which is removable by sliding along the partition grooves 51a, 51b in the longitudinal direction.

In this apparatus 10B for manufacturing semiconductor devices of the second embodiment, the distance between the first guide grooves 14 (14a, 14b) and the guide supports 52 (52a, 52b) in the up and down direction is set to be larger than the gap between the first guide grooves 14 and the second guide grooves 15 in the up and down direction in the apparatus 10A for manufacturing semiconductor devices of the first embodiment. Further, when the lower semiconductor package 73 is inserted into the insertion space 11 along the first guide grooves 14 and the upper semiconductor package 74 is inserted into the insertion space 11 along the guide supports 52, the partition plate 53 partitions the insertion space 11 into a space in which the lower semiconductor package 73 is inserted and a space in which the upper semiconductor package 74 is inserted. In this regard, it is to be noted that the position of the partition grooves 51 (51a, 51b) with respect to the first guide grooves 14 and the guide supports 52 is set so that the lands 75 and the solder balls 76 do not make contact with the partition plate 53. Further, the apparatus 10B for manufacturing semiconductor devices may include stopper plates corresponding to the first stopper plate 17 and the second stopper plate 18.

Next, a method of manufacturing semiconductor devices using the apparatus 10B for manufacturing semiconductor devices will be described.

First, the apparatus 10B for manufacturing semiconductor devices is arranged so that the through holes 12 face upward in the drawings. Then, in the state where the partition plate 53 is loosely fitted into the partition grooves 51, the upper semiconductor package 74 is inserted into the insertion space 11 along the guide supports 52 (second guide grooves 15), and the lower semiconductor package 73 on which a flux has been applied in advance on the surface provided with the lands 75 is inserted into the insertion space 11 along the first guide grooves 14. At this time, the upper semiconductor package 74 is inserted so that the surface provided with the solder balls 76 faces upward in the drawings, and the lower semiconductor package 73 is inserted so that the surface on which the flux is applied faces downward in the drawings (that is, so that the surface provided with the lands 75 faces downward). In this way, the solder balls 76 and the lands 75 face each other inside the insertion space 11 (see FIG. 9(a)).

Next, the apparatus 10B for manufacturing semiconductor devices is inverted in the up and down direction in the drawings. At this time, because the protruding portions 16 (16a, 16b) are provided on the lower semiconductor package 73 side of the partition plate 53, the upper semiconductor package 74 moves downward in the drawings and is stopped by coming into contact with the partition plate 53 (see FIG. 9(b)). Then, by sliding the partition plate 53 to remove it from the insertion space 11, the upper semiconductor package 74 moves further downward in the drawings, and then the solder balls 76 make contact with corresponding lands 75 (see FIG. 9(c)). At this time, because the upper semiconductor package 74 only moves a small distance downward in the drawings, the solder balls 76 make gentle contact with the lands 75.

As described above, in the apparatus 10B for manufacturing semiconductor devices of the second embodiment, because the flat plate-shaped partition plate 53 is provided between the first guide grooves 14 and the guide supports 52, an inadvertent contact between the lower semiconductor package 73 and the upper semiconductor package 74 is prevented at the time the upper semiconductor package 74 is inserted into the insertion space 11. Further, when the apparatus 10B for manufacturing semiconductor devices is inverted in the up and down direction, it is possible to prevent dislocation of the solder balls 76 from corresponding lands 75 due to powerful collisions between the solder balls 76 of the upper semiconductor package 74 and the lands 75 of the lower semiconductor package 73. As a result, it is possible to improve the yield of the manufactured semiconductor devices 70, and the reliability of the finally obtained semiconductor devices 70 can be made especially high.

Then, using the pressing device 40, the upper semiconductor package 74 is pressed by a prescribed load (see FIG. 10(d)). Namely, using the pressing device 40, a prescribed load is added to the lower semiconductor package 73 via the upper semiconductor package 74. Next, with the upper semiconductor package 74 in this pressed state, the apparatus 10B for manufacturing semiconductor devices is conveyed to the inside of a reflow furnace, and the upper semiconductor package 74 and the lower semiconductor package 73 are connected or soldered by reflow.

Then, after the apparatus 10B for manufacturing semiconductor devices is removed from the reflow furnace and the pressing by the pressing device is released, a semiconductor device 70 that was formed by connecting the upper semiconductor package 74 to the lower semiconductor package 73 by reflowing is removed from the apparatus 10B (see FIG. 10(e)).

Next, an apparatus for manufacturing semiconductor devices according to a third embodiment of the present invention will be described. This description will focus on the points of difference with the first and second embodiments, and therefore a description of the same elements is omitted.

Figure 11:
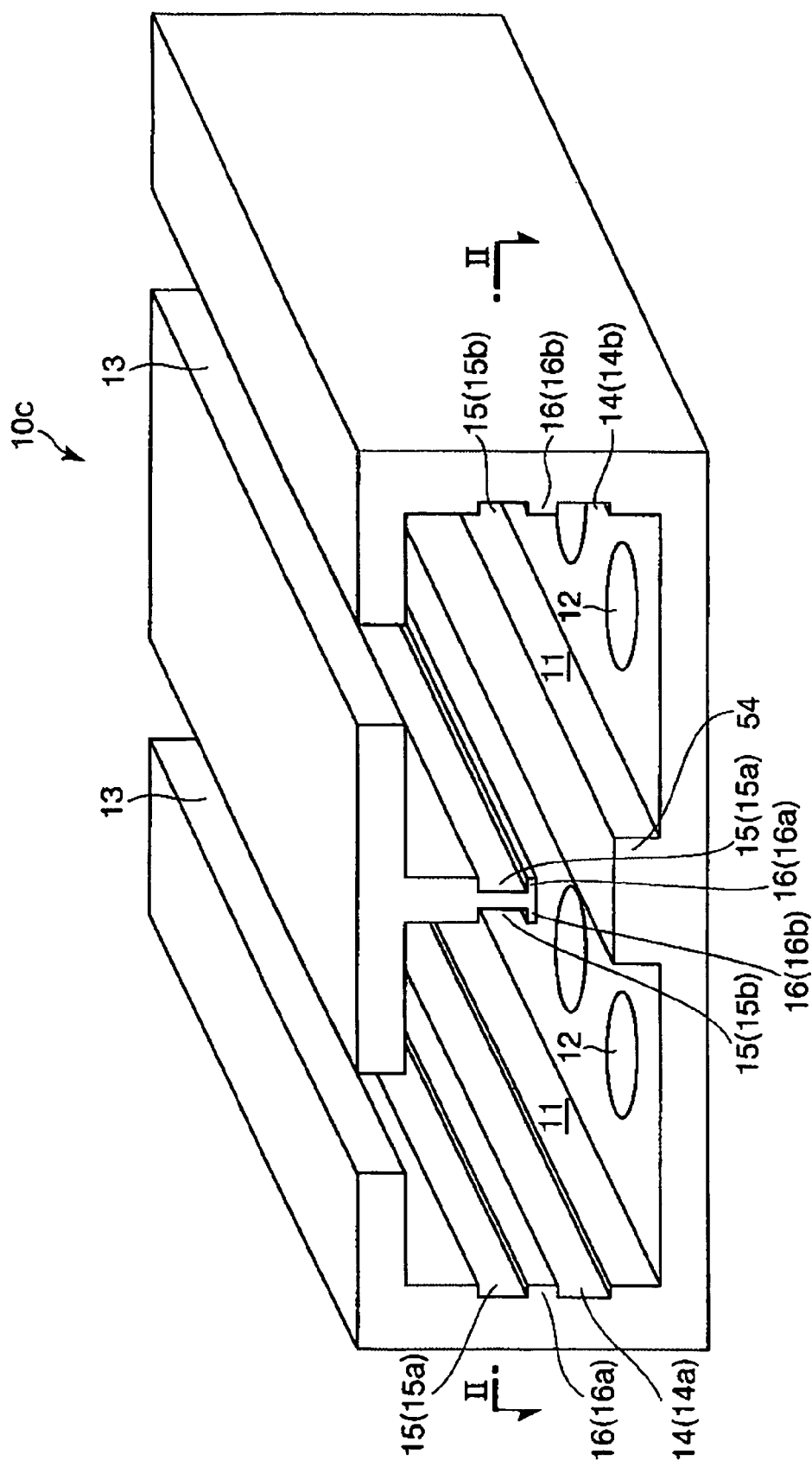
FIG. 11 is a perspective view which shows an apparatus for manufacturing semiconductor devices according to a third embodiment of the present invention.
Figure 12:
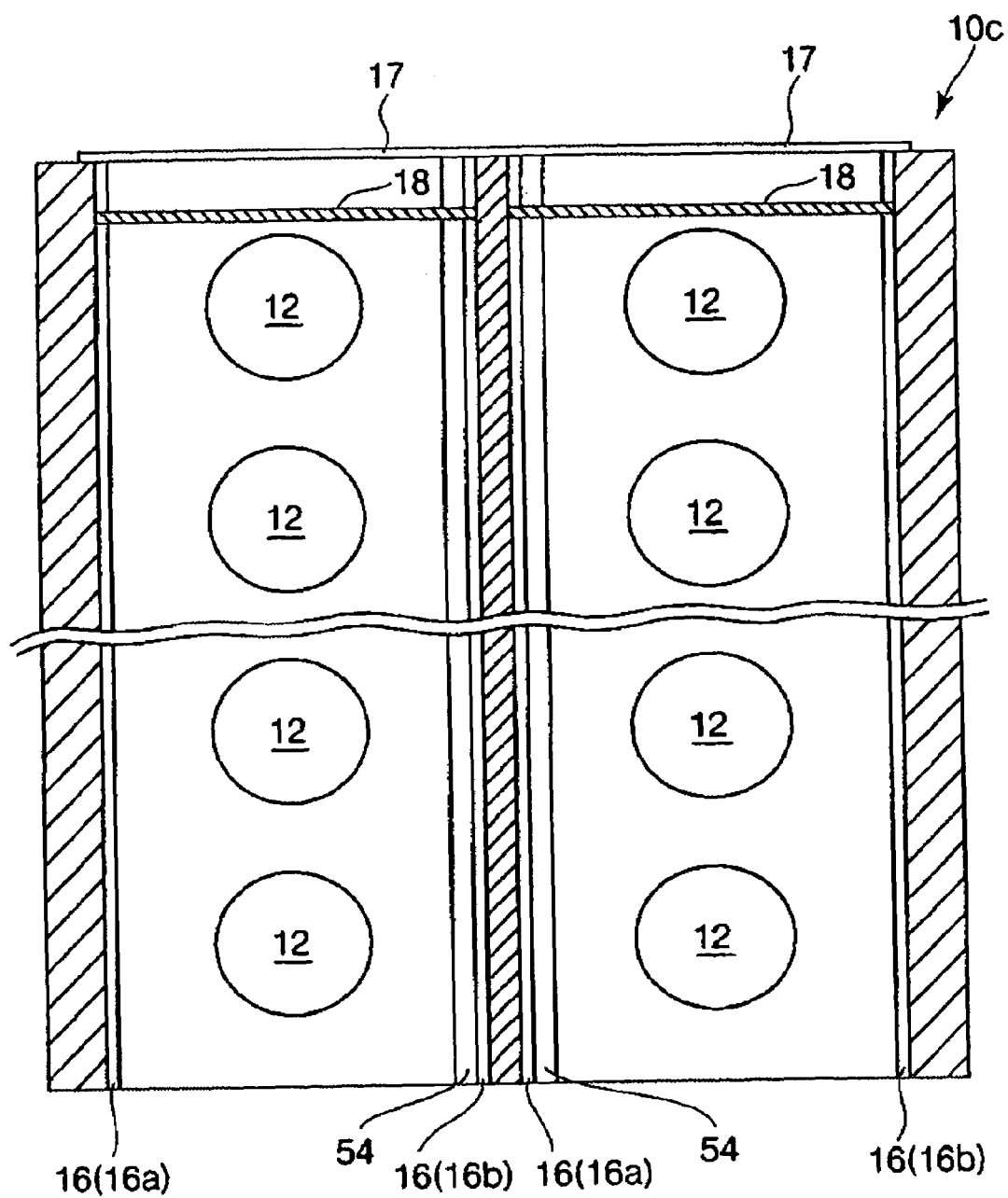
FIG. 12 is a cross-sectional view taken along the lines II-II in FIG. 11.
Figure 13:
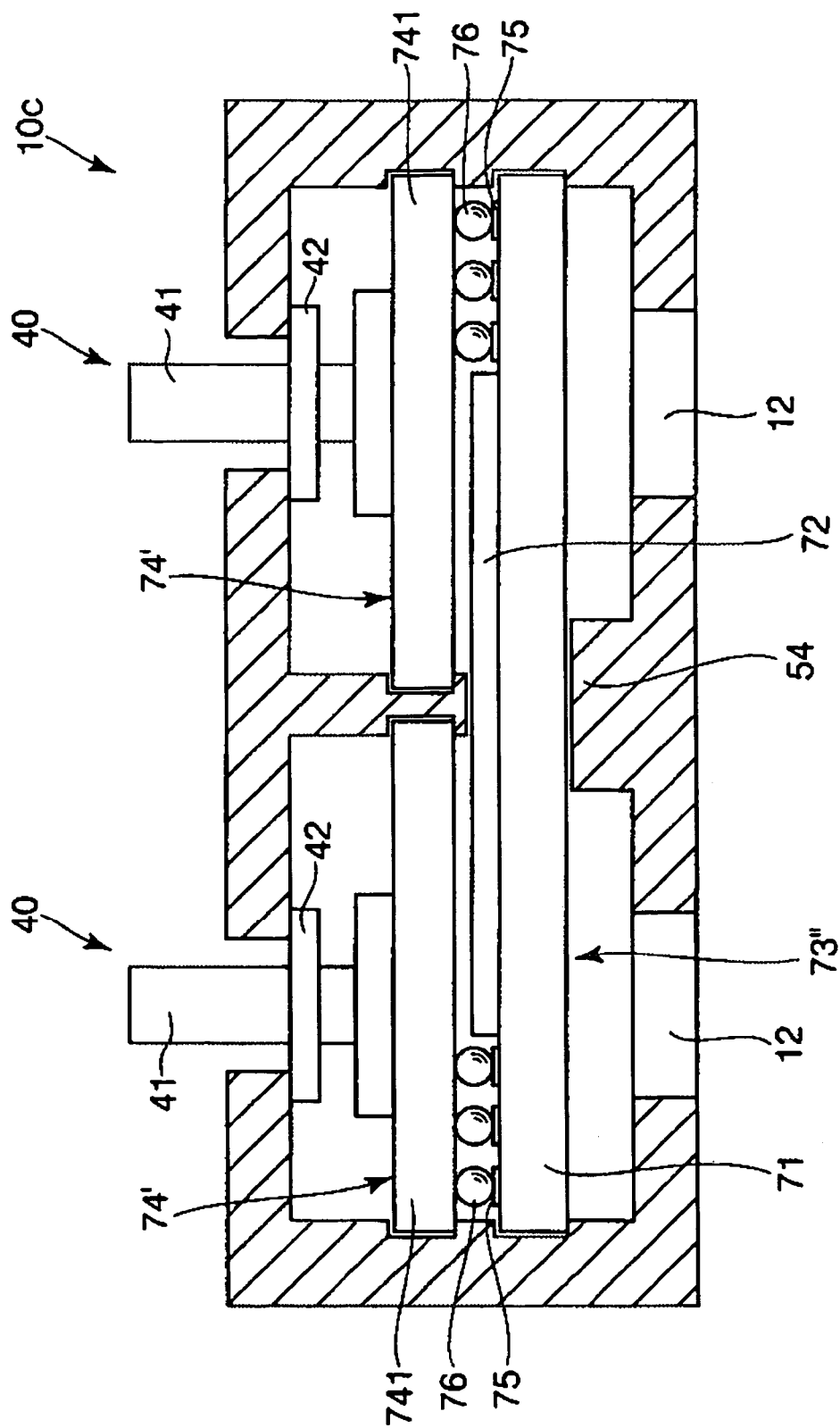
FIG. 13 is a cross-sectional view which shows one process in a manufacturing method using the apparatus for manufacturing semiconductor devices shown in FIG. 11 and FIG. 12.
Figure 14:
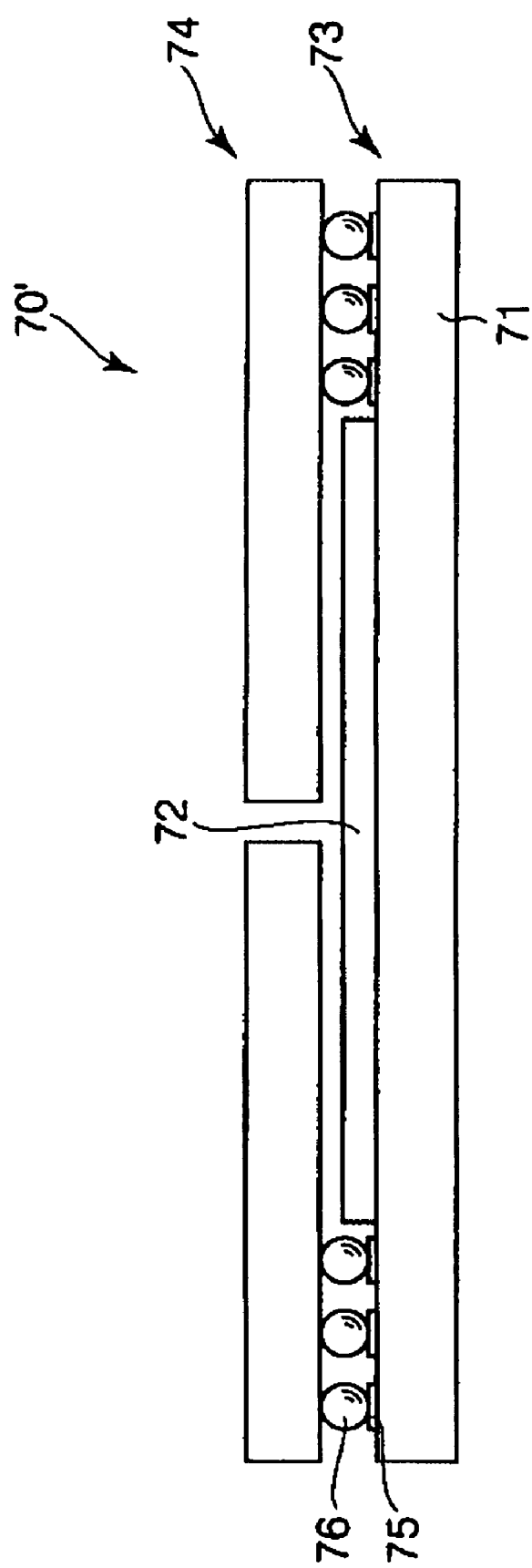
FIG. 14 is a cross-sectional view which shows one example structure of a semiconductor device manufactured by the apparatus for manufacturing semiconductor devices shown in FIG. 11 and FIG. 12.

FIG. 11 is a perspective view which shows an apparatus for manufacturing semiconductor devices according to the third embodiment of the present invention, FIG. 12 is a cross-sectional view taken along the lines II-II in FIG. 11, FIG. 13 is a cross-sectional view which shows one process in a manufacturing method using the apparatus for manufacturing semiconductor devices shown in FIG. 11 and FIG. 12, and FIG. 14 is a cross-sectional view which shows one example structure of a semiconductor device manufactured by the apparatus for manufacturing semiconductor devices shown in FIG. 11 and FIG. 12. Further, the upper side in FIG. 11 and FIG. 13 is referred to as "upper", and the lower side is referred to as "lower".

As shown in FIG. 11 and FIG. 12, an apparatus 10C for manufacturing semiconductor devices of the third embodiment is provided with two sets of the second guide grooves 15a, 15b which loosely hold upper semiconductor packages 74' (which are movably supported in the first direction), respectively. The two sets of the second guide grooves 15a, 15b are constructed so that the upper semiconductor packages 74' can be arranged along a line in the left and right direction in the drawings. In this way, it is possible to manufacture a semiconductor device 70' in which a plurality of upper semiconductor packages 74' are mounted (connected) to the top of one lower semiconductor package 73" like that shown in FIG. 14.

Further, in the apparatus 10C for manufacturing semiconductor devices, a protruding portion 54 is provided at the bottom (on the inner wall surface where the through holes 12 are formed). By providing such a protruding portion 54, it is possible to more effectively prevent warping and the like of the lower semiconductor package 73" having a large surface area at the time when the upper semiconductor packages 74' are pressed, and at the time when the lower semiconductor package 73" and the upper semiconductor packages 74' are connected (undergoing reflow) (see FIG. 13).

Further, the apparatus 10C for manufacturing semiconductor devices is equipped with a first stopper plate 17 arranged to span the space from the first guide groove 14a to the first guide groove 14b at one end (rear end) in the longitudinal direction of the guide grooves (first guide grooves 14 and second guide grooves 15), and second stopper plates 18 arranged to span the spaces from the second guide grooves 15a to the second guide grooves 15b at positions shifted only a prescribed distance from one end (rear end) toward the other end (front end) in the longitudinal direction described above. Namely, in this third embodiment, the first stopper plate 17 and the second stopper plates 18 are arranged at different positions in the longitudinal direction of the guide grooves (first guide grooves 14 and second guide grooves 15). According to this structure, even in the case where the length from the second side 732b (the edge portion at the side that abuts on the first stopper plate 17) of the lower semiconductor package 73' to the lands 75 and the length from the edge portion (the edge portion at the side that abuts on the second stopper plates 18) of the upper semiconductor packages 74' to the solder balls 76 is different, for example, the relative positions of the lower semiconductor package 73' and the upper semiconductor packages 74' can be suitably regulated.

The apparatus 10C for manufacturing semiconductor devices is used in the same way as in the previous embodiments, for example.

The apparatus for manufacturing semiconductor devices, the method of manufacturing semiconductor devices and the semiconductor device according to the present invention were described based on the embodiments shown in the drawings, but it should be noted that the present invention is not limited to these embodiments.

For example, in the embodiments described above, the lower semiconductor package was described as being inserted after the upper semiconductor package is inserted in the insertion space, but the lower semiconductor package may be inserted first, or the upper semiconductor package and the lower semiconductor package may be inserted at the same time.

Further, in the embodiments described above, the pressing device was described as being arranged to press the upper semiconductor package, but the arrangement of the pressing device may be changed to press the lower semiconductor package, or two or more pressing devices may be used to press the lower semiconductor package and the upper semiconductor package, respectively.

Further, in the embodiments described above, the apparatus for manufacturing semiconductor devices was described as being inverted to make the upper semiconductor package come into contact with the lower semiconductor package, but instead of inverting the apparatus for manufacturing semiconductor devices, the apparatus for manufacturing semiconductor devices may be arranged with the through holes facing downward, and the groove width of the first grooves may be given extra space. According to this structure, it is possible for the lower semiconductor package to be pushed upward from below to make contact with the upper semiconductor package.

Finally, it is to be noted that the present invention is not limited to the embodiments described above, and many changes and additions may be made without departing from the scope of the present invention which is defined by the following claims.

The entire disclosure of Japanese Patent Application No. 2003-320008 filed Sep. 11, 2003 is incorporated by reference.

What is claimed is:

1. An apparatus for manufacturing semiconductor devices, each semiconductor device comprising a substantially rectangular plate-shaped substrate for mounting semiconductor components thereon and a plate-shaped semiconductor component which is joined to the substrate for mounting semiconductor components, the substrate for mounting semiconductor components having first opposite sides extending along a first direction and second opposite sides extending along a second direction which is substantially perpendicular to the first direction, the apparatus comprising:

first guide grooves which support the first sides of the substrate for mounting semiconductor components in a freely movable manner along the first direction while restricting the movement of the substrate for mounting semiconductor components in the second direction; and second guide grooves which loosely hold edge portions of the semiconductor component while restricting the movement of the semiconductor component in the second direction.

2. The apparatus for manufacturing semiconductor devices as claimed in claim 1, further comprising a restrictor which restricts the relative movement of the semiconductor component in the first direction with respect to the substrate for mounting semiconductor components.

3. The apparatus for manufacturing semiconductor devices as claimed in claim 1, wherein the width of each of the second guide grooves is larger than the thickness of the semiconductor component.

4. The apparatus for manufacturing semiconductor devices as claimed in claim 3, wherein when the substrate for mounting semiconductor components and the semiconductor component are loosely fitted into the first guide means and the second guide means, respectively, the difference between the width of each groove of the first guide means and the thickness of a portion of the substrate for mounting semiconductor components which is loosely fitted to the first guide means is smaller than the difference between the width of each groove of the second guide means and the thickness of a portion of the semiconductor component which is loosely fitted to the second guide grooves.

5. The apparatus for manufacturing semiconductor devices as claimed in claim 1, wherein the apparatus is formed into a roughly box-shape.

6. The apparatus for manufacturing semiconductor devices as claimed in claim 1, wherein the substrate for mounting semiconductor components and the semiconductor component can be inverted in up and down directions.

7. The apparatus for manufacturing semiconductor devices as claimed in claim 1, wherein the substrate for mounting semiconductor components is formed into a frame shape on which two or more of the semiconductor components can be mounted and the semiconductor components are formed into individual units.

8. The apparatus for manufacturing semiconductor devices as claimed in claim 7, wherein two or more of the semiconductor components are mounted on the substrate for mounting semiconductor components so that the semiconductor components are arranged along a plurality of lines.

9. The apparatus for manufacturing semiconductor devices as claimed in claim 1, further comprising a presser which presses the substrate for mounting semiconductor components and/or the semiconductor component so as to bring the semiconductor component close to the substrate for mounting semiconductor components.

10. The apparatus for manufacturing semiconductor devices as claimed in claim 1, further comprising a plate-shaped partition section arranged between the first guide grooves and the second guide grooves.

11. An apparatus for manufacturing semiconductor devices, each semiconductor device comprising a substantially rectangular plate-shaped substrate for mounting semiconductor components thereon and a plate-shaped semiconductor component which is joined to the substrate for mounting semiconductor components, the substrate for mounting semiconductor components having first opposite sides extending along a first direction and second opposite sides extending along a second direction which is substantially perpendicular to the first direction, the apparatus comprising:
- a first guider which supports the first sides of the substrate for mounting semiconductor components in a freely movable manner along the first direction while restricting the movement of the substrate for mounting semiconductor components in the second direction; and
- a second guider which loosely holds edge portions of the semiconductor component while restricting the movement of the semiconductor component in the second direction,
- wherein the substrate for mounting semiconductor components and the semiconductor component can be inverted in up and down directions.

12. An apparatus for manufacturing semiconductor devices, each semiconductor device comprising a substantially rectangular plate-shaped substrate for mounting semiconductor components thereon and a plate-shaped semiconductor component which is joined to the substrate for mounting semiconductor components, the substrate for mounting semiconductor components having first opposite sides extending along a first direction and second opposite sides extending along a second direction which is substantially perpendicular to the first direction, the apparatus comprising:
- a first guider which supports the first sides of the substrate for mounting semiconductor components in a freely movable manner along the first direction while restricting the movement of the substrate for mounting semiconductor components in the second direction; and
- a second guider which loosely holds edge portions of the semiconductor component while restricting the movement of the semiconductor component in the second direction,
- wherein the substrate for mounting semiconductor components and the semiconductor component can be inverted in up and down directions.

13. An apparatus for manufacturing semiconductor devices, each semiconductor device comprising a substantially rectangular plate-shaped substrate for mounting semiconductor components thereon and a plate-shaped semiconductor component which is joined to the substrate for mounting semiconductor components, the substrate for mounting semiconductor components having first opposite sides extending along a first direction and second opposite sides extending along a second direction which is substantially perpendicular to the first direction, the apparatus comprising:
- a first guider which supports the first sides of the substrate for mounting semiconductor components in a freely movable manner along the first direction while restricting the movement of the substrate for mounting semiconductor components in the second direction; and
- a second guider which loosely holds edge portions of the semiconductor component while restricting the movement of the semiconductor component in the second direction,
- a plate-shaped partition section arranged between the first guider and the second guider.

* * * * *